(12) United States Patent
Jain (10) Patent No.: US 11,909,409 B1
(45) Date of Patent: Feb. 20, 2024

(54) LOW JITTER PLL

(71) Applicant: Faraday Technology Corp., Hsin-Chu (TW)

(72) Inventor: Vinod Kumar Jain, Beaverton, OR (US)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 17/893,191

(22) Filed: Aug. 23, 2022

(51) Int. Cl.
*H03L 7/099* (2006.01)
*H03L 7/197* (2006.01)
*H03L 7/089* (2006.01)

(52) U.S. Cl.
CPC .......... *H03L 7/1976* (2013.01); *H03L 7/0891* (2013.01); *H03L 7/099* (2013.01)

(58) Field of Classification Search
CPC .. H03D 3/24; H03M 3/00; H03M 3/30; H03L 1/00; H03L 7/00; H03L 7/06; H03L 7/08; H03L 7/18; H03L 7/099; H03L 7/197; H03L 7/0891; H03L 7/1967; H04B 5/00; H04L 7/00; H04L 7/033
USPC ............... 327/141, 147, 148, 156, 157, 160; 331/15, 17, 36; 375/347, 350, 373, 376
See application file for complete search history.

(56) References Cited

U.S. PATENT DOCUMENTS

| | | | |
|---|---|---|---|
| 6,236,278 B1 * | 5/2001 | Olgaard | H03L 7/18 331/25 |
| 7,079,616 B2 | 7/2006 | Castiglione | |
| 7,791,385 B2 * | 9/2010 | Huang | H03K 23/68 327/159 |
| 8,779,812 B1 | 7/2014 | Kavanagh | |
| 9,559,704 B1 * | 1/2017 | Wong | H03L 7/18 |
| 11,095,293 B1 * | 8/2021 | Sahu | H03L 7/1976 |
| 2007/0147571 A1 | 6/2007 | Yu | |
| 2022/0014205 A1 | 1/2022 | Petrov | |

FOREIGN PATENT DOCUMENTS

TW 200509538 3/2005

\* cited by examiner

*Primary Examiner* — Shawkat M Ali
(74) *Attorney, Agent, or Firm* — Winston Hsu (57) ABSTRACT

A Phase Locked Loop (PLL) with reduced jitter includes: a phase detector, for comparing the phases of a reference clock and feedback clock to generate up and down control signals; a Voltage Controlled Oscillator (VCO) for generating an oscillation signal; an output divider, for dividing the oscillation signal to generate an output clock; a fractional feedback divider for receiving the oscillation signal and performing frequency division on the oscillation signal according to a modulated sequence to generate a modulated clock; and a divider coupled in series to the fractional feedback divider, for dividing the modulated clock of the fractional feedback divider by a fixed modulus to generate a divided clock. A frequency of the modulated clock of the fractional feedback divider is an integer multiple of the frequency of the divided clock, and one of the modulated clock and divided clock is used as the feedback clock.

14 Claims, 6 Drawing Sheets

LOW JITTER PLL

BACKGROUND OF THE INVENTION

1. Field of the Invention

The invention is directed to Phase Locked Loops (PLLs), and more particularly, to a PLL that can reduce output jitter.

2. Description of the Prior Art

A standard PLL uses a negative feedback mechanism to perform frequency multiplication to generate a stable output frequency with respect to a phase detector comparison frequency, by comparing a reference frequency with a feedback frequency provided via the negative feedback mechanism. The reference frequency is an input signal which is divided down by a factor of N. Once the PLL is locked, the output frequency will be equal to the reference frequency x N. Therefore, by changing the value of N, the PLL can be tuned across a particular frequency band, as long as the minimum frequency resolution is equal to the reference frequency. When a new value of N is programmed, the phase detector will create an error voltage based on the phase difference of the two input signals, which is used to drive a voltage oscillator for generating the output frequency.

Figure 1:
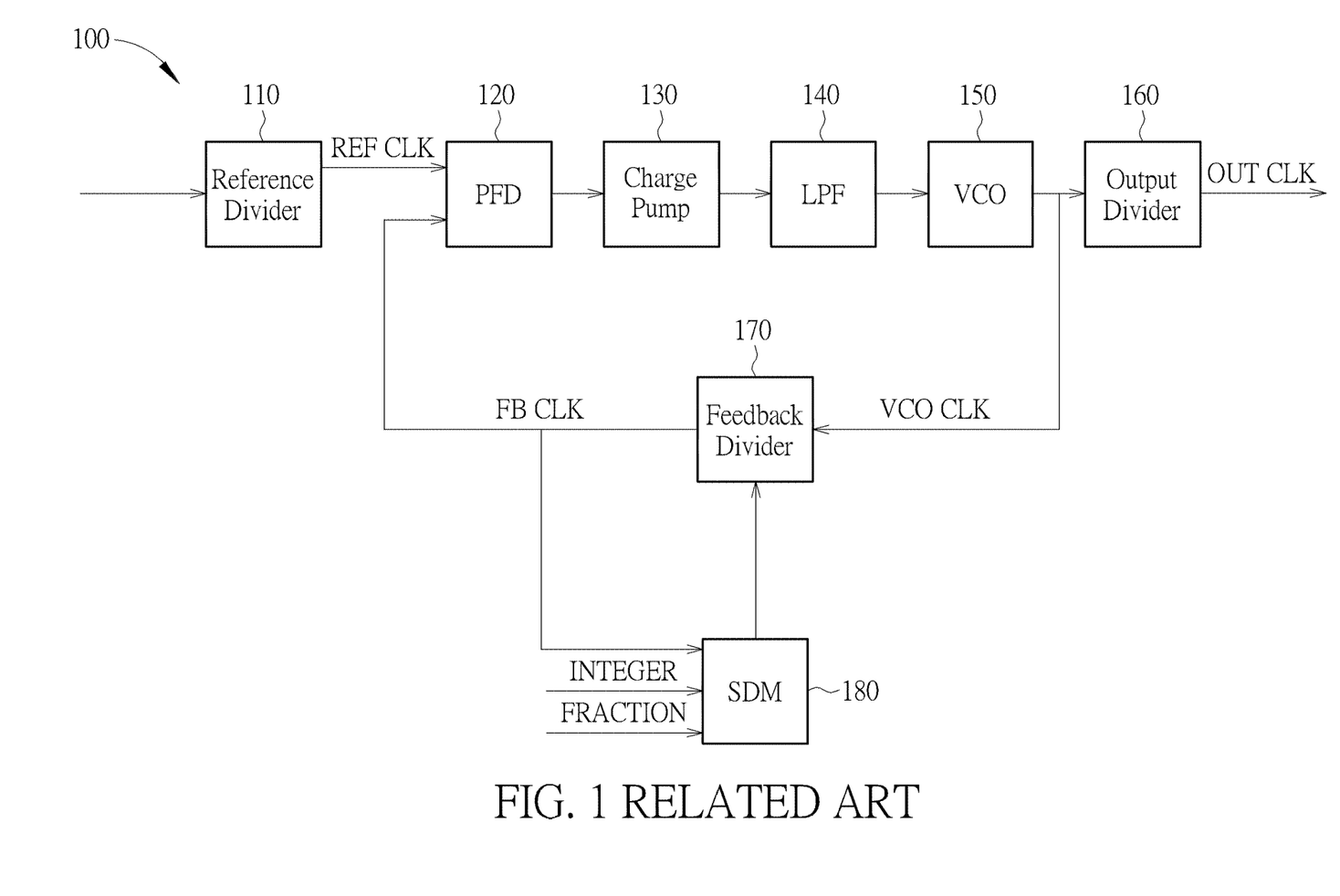
FIG. 1 is a diagram of a PLL according to the related art.

Refer to FIG. 1, which is a diagram of a PLL 100 according to the related art. As shown in the diagram, the PLL 100 comprises a Reference Divider 110, a Phase Frequency Detector (PFD) 120, a Charge Pump 130, a Low Pass Filter 140, a Voltage Controlled Oscillator (VCO) 150, and an Output Divider 160. In addition, the PLL 100 comprises a feedback loop comprising a Feedback Divider 170 and a Sigma Delta Modulator 180.

The Reference Divider 110 receives an input signal/clock and divides down this input clock to generate a reference clock (REF CLK). This REF CLK is input to the PFD 120, which compares positive edges of the REF CLK with positive edges of a feedback signal (FB CLK) output from the Feedback Divider 170 to generate a digital output. The digital output will be a pulsed signal wherein the width of the pulses is proportional to the phase difference between the positive edges of the two signals, and is input to the Charge Pump 130 for generating an analog current representing the phase error. This analog current is input to the Loop Filter 140 for generating a VCO control voltage for driving the VCO 150. The resultant multi-phase output is sent to the Output Divider 160, which generates an output clock OUT CLK. The VCO CLK (output) will have a frequency which is an integer multiple of the REF CLK. The output of the VCO 150 is also sent to the Feedback Divider 170, which forms a feedback loop by comparing the VCO CLK with a divider modulus N to generate a feedback clock (FB CLK) which is sent to the PFD 120. When the PLL 100 is locked, the REF CLK and FB CLK will be the same, so that VCO CLK=N×FB CLK. Therefore, by changing the value of N, the output frequency of OUT CLK can be changed The PLL 100 acts as a low-pass filter with respect to the REF CLK and Charge Pump output, wherein high frequency jitter will be rejected. With respect to noise output by the VCO, however, the PLL 100 acts as a high pass filter. Noise output by the PLL 100 therefore depends on the operating bandwidth (the modulating frequency at which the PLL 100 can maintain a locked state). Due to the discrete sampling at edges of the REF CLK by the PFD 120, the loop filter bandwidth should be about ⅒ of the reference frequency.

Increasing the loop filter bandwidth will improve the settling (lock) time of the PLL, but the output will become unstable at higher reference frequencies. Lower reference frequencies can improve the frequency resolution of the PLL, but also increase the settling time and the VCO noise. There is therefore a tradeoff between bandwidth and tuning resolution of the PLL 100.

To improve the tuning resolution, fractional PLLs have been developed, wherein the divider modulus is not limited to being an integer. This allows for greater fine tuning. As the divider modulus cannot be fractional in practice, the divider modulus is updated every reference period, for example by switching between two different integer values of N (e.g. N and N+1). Over a plurality of clock periods, the average value will converge to the desired fractional value.

As the difference between the actual divider modulus and the ideal (average) modulus will be seen as an error, phase noise thereof is generated, resulting in spurious tones occurring at low frequencies. The only way to suppress these spurious tones is by lowering the BW of the PLL, which will make it impractical for most purposes. The PLL 100 (and specifically the feedback loop) therefore includes the Sigma Delta Modulator (SDM) 180, which solves the above issue by introducing randomness to the generated modulus to break up the periodicity. The generated random sequence ensures that the resultant quantization noise has most power in a frequency band above the PLL desired BW.

By creating this dynamic and periodic changing in the divider value, however, there will be a periodic low frequency disturbance. This quantization noise typically peaks at half the frequency of the SDM CLK. The SDM CLK is usually at the frequency of the FB CLK (i.e. the same frequency as the REF CLK or $F_{REF}$), meaning the quantization noise peaks at $F_{REF}/2$. As a characteristic of a PLL is that low frequency signals will be passed due to the LPF 140, this low frequency disturbance will also be passed and will be seen at the output.

A method to reduce this noise would be to reduce the PLL bandwidth so that less jitter will be passed. This causes the same problems seen with standard fractional PLLs, i.e. that the LPF 140 must have a small enough bandwidth to give a stable output, and prevent the VCO 150 from drifting. Additionally, certain procedures have particular protocols which require a specific operating bandwidth.

U.S. Pat. No. 9,559,704 includes a multiplier coupled to the SDM, as well as a divider which is coupled between the SDM and the fractional frequency divider. Both the multiplier and the divider have a same modulus. This structure allows for finer tuning resolution; for example, if the modulus is 2, the circuit can provide a modulus which changes between N and N+0.5, rather than between N and N+1, as in standard PLLs.

In addition, U.S. Pat. No. 8,933,733 provides a PLL which can operate in both integer and fractional mode, by providing an MMD divider coupled in parallel to an integer divider. A MUX receives outputs from both dividers, and dynamically selects between the outputs according to the particular reference clock source.

Although both prior arts improve the performance of the PLL by improving the tuning resolution, the resultant noise from the SDM will still be seen at the output. Therefore, the jitter problem is not solved.

There is therefore a need for a novel solution which can reduce the noise generated by sigma delta fractional PLLs without reducing the operating bandwidth.

SUMMARY OF THE INVENTION

This in mind, it is an objective of the present invention to provide a circuit and a method for generating a PLL output clock which has reduced jitter.

This is achieved by a Phase Locked Loop (PLL) comprising: a phase detector, for receiving a reference clock and a feedback clock, and comparing the phases of the reference clock and feedback clock to generate up and down control signals; a Voltage Controlled Oscillator (VCO) for generating an oscillation signal according to the up and down control signals; an output divider, for dividing the oscillation signal to generate an output clock; and a feedback loop, for receiving the oscillation signal and dividing the oscillation signal according to a modulus to generate the feedback clock. The feedback loop comprises: a fractional feedback divider for receiving the oscillation signal and performing frequency division on the oscillation signal according to a modulated sequence to generate a modulated clock wherein over a plurality of clock cycles the average of the modulated sequence is a fractional number; and a divider coupled in series to the fractional feedback divider, for dividing the modulated clock of the fractional feedback divider by a fixed modulus to generate a divided clock. A frequency of the modulated clock of the fractional feedback divider is an integer multiple of the frequency of the divided clock.

The feedback loop further comprises a Sigma Delta Modulator (SDM), coupled to the fractional feedback divider, for generating the modulated sequence according to an integer division factor and a fractional division factor. The SDM further generates a phase select signal to the fractional feedback divider, and receives the modulated clock of the fractional feedback divider. A Multiplexer (MUX) receives the divided clock from the divider and the modulated clock from the SDM, and according to an input signal, and outputs either the divided clock or the modulated clock to the phase detector as the feedback clock. When the input signal is high, the PLL is configured as an integer-N PLL, the SDM generates the modulated sequence according to the integer input only, and the MUX directly selects the modulated clock output from the fractional feedback divider as the feedback clock. When the input signal is low, the PLL is configured as a fractional-N PLL, the SDM generates the modulated sequence according to both the integer input and the fractional input, and the MUX selects the divided clock output from the divider as the feedback clock.

The Phase Locked Loop further comprises: a charge pump that generates an analog control signal according to the up and down control signals output by the phase detector; and a loop filter for filtering the analog control signal to generate a filtered signal which is input to the VCO. In an embodiment, the frequency of the modulated clock of the fractional feedback divider is double the frequency of the divided clock.

A method for generating an output clock with reduced jitter from a reference clock comprises: receiving a reference clock and a feedback clock, and comparing the phases of the reference clock and feedback clock to generate up and down control signals; generating an oscillation signal according to the up and down control signals; performing frequency division on the oscillation signal according to a modulated sequence to generate a modulated clock wherein over a plurality of clock cycles the average of the modulated sequence is a fractional number; dividing the modulated clock by a fixed modulus to generate a divided clock; and using one of the modulated clock and the divided clock as the feedback clock. A frequency of the modulated clock is an integer multiple of the frequency of the divided clock.

The step of performing frequency division on the oscillation signal according to a modulated sequence further comprises generating the modulated sequence according to an integer division factor and a fractional division factor. The method further comprises generating a phase select signal.

The step of generating an oscillation signal according to the up and down signals comprises: generating an analog control signal according to the up and down control signals; and filtering the analog control signal to generate a filtered signal, which is used to generate the oscillation signal.

One of the divided clock or the modulated clock is used as the feedback clock according to an input signal. When the input signal is high, the modulated clock is selected as the feedback clock; and when the input signal is low, the divided clock is selected as the feedback clock. In an embodiment, the frequency of the modulated clock is double the frequency of the divided clock.

These and other objectives of the present invention will no doubt become obvious to those of ordinary skill in the art after reading the following detailed description of the preferred embodiment that is illustrated in the various figures and drawings.

DETAILED DESCRIPTION

It is a primary objective of the invention to provide a PLL which, in fractional mode, can generate an SDM clock at a higher frequency than the reference frequency, such that the phase noise/jitter generated by a Sigma Delta Modulator (SDM) within the PLL will also be at a higher frequency and will therefore be filtered out due to the PLL's low-pass characteristics.

Figure 2:
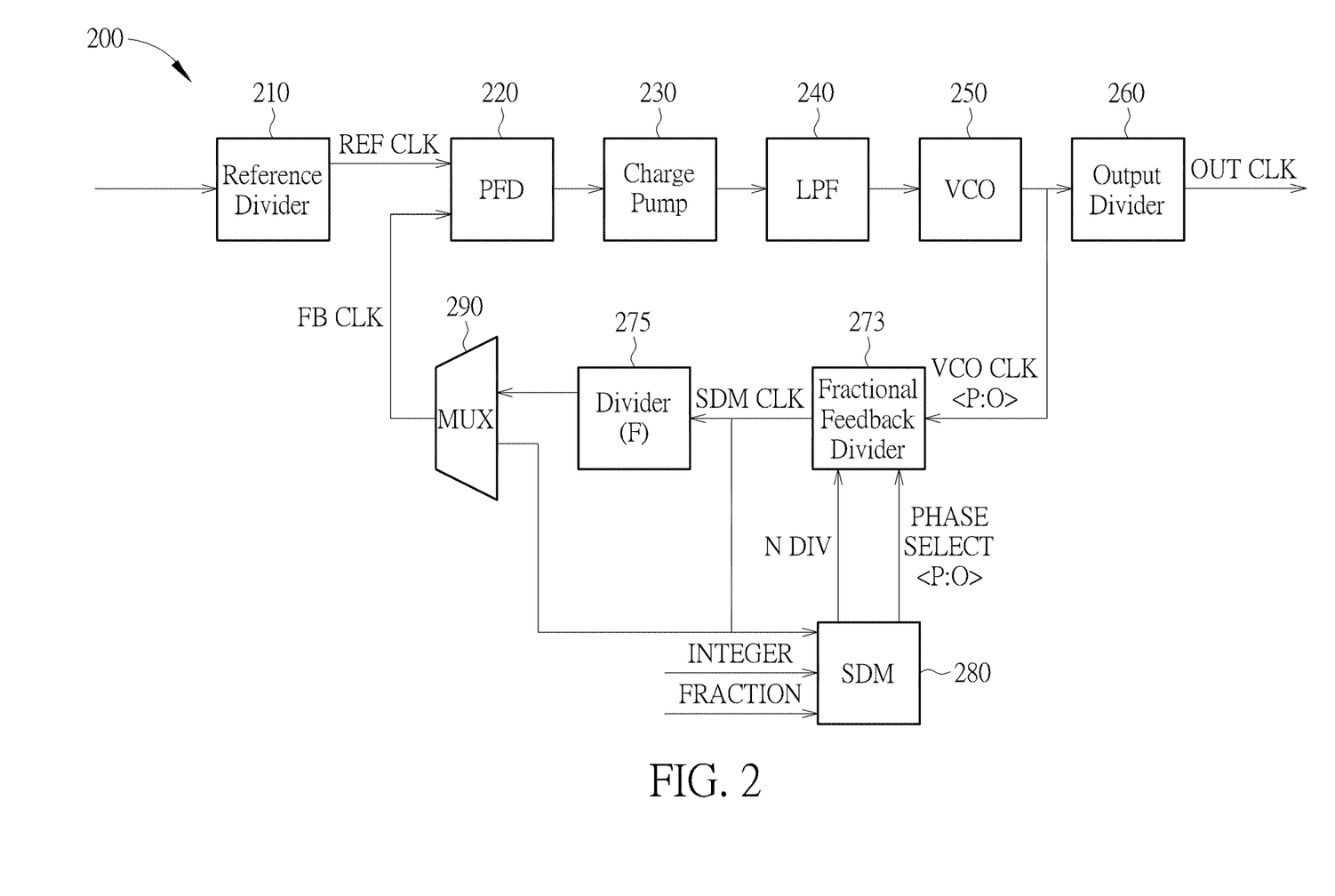
FIG. 2 is a diagram of a PLL according to an exemplary embodiment of the invention.

Refer to FIG. 2, which illustrates a PLL 200 according to an exemplary embodiment of the present invention. The PLL 200 comprises a reference divider 210, a phase frequency detector 220, a Charge Pump 230, a loop filter 240, a voltage controlled oscillator (VCO) 250, and an output divider 260. As can be seen by comparing this diagram with FIG. 1, the difference between this PLL 200 and the PLL 100 shown in FIG. 1 is the feedback loop. As shown in FIG. 2, the feedback loop of the PLL 200 comprises two dividers in cascade: a fractional feedback divider 273, and a divider (F) 275, as well as a sigma delta modulator (SDM) 280, and a MUX 290.

As detailed in the background section, a sigma delta modulator works by generating a random sequence to achieve a desired fractional modulus. The fractional modulus will consist of an integer part and a fraction part, which are both input to the SDM 280, as illustrated in the diagram. Using these inputs, the SDM 280 will generate a modulus N DIV to the fractional feedback divider 273, which changes dynamically for each clock cycle. The SDM also generates a phase select signal <P:0> to the fractional feedback divider 273, which also receives a phase select signal VCO CLK <P:0> from the VCO 250, and these phase select signals are used in combination with the modulated sequence N DIV, to divide the VCO CLK according to the modulated sequence.

So far, the PLL 200 operates as a standard sigma delta fractional PLL. The difference is in the second divider, the Divider (F) 275. By providing this second divider in cascade with the fractional feedback divider 273, the SDM CLK generated by the fractional feedback divider 273 can be generated at double the frequency required while still allowing the FB CLK to be generated at its desired frequency. This means that quantization noise generated by the SDM CLK will peak at a higher frequency than in the prior art, and can be filtered out by the PLL 200.

In addition, the PLL 200 can operate in both integer mode and fractional mode via the MUX 290. As shown in FIG. 2, the MUX 290 receives the divided clock from the Divider (F) 275 as well as the SDM CLK from the fractional feedback divider 273. Additionally, the SDM CLK is fed back to the SDM 280. An input signal 'Integer Mode' is input to the MUX 290; when the signal is active, the PLL 200 will operate in integer mode, and when the signal is not active, the PLL 200 will operate in fractional mode.

Figure 3A:
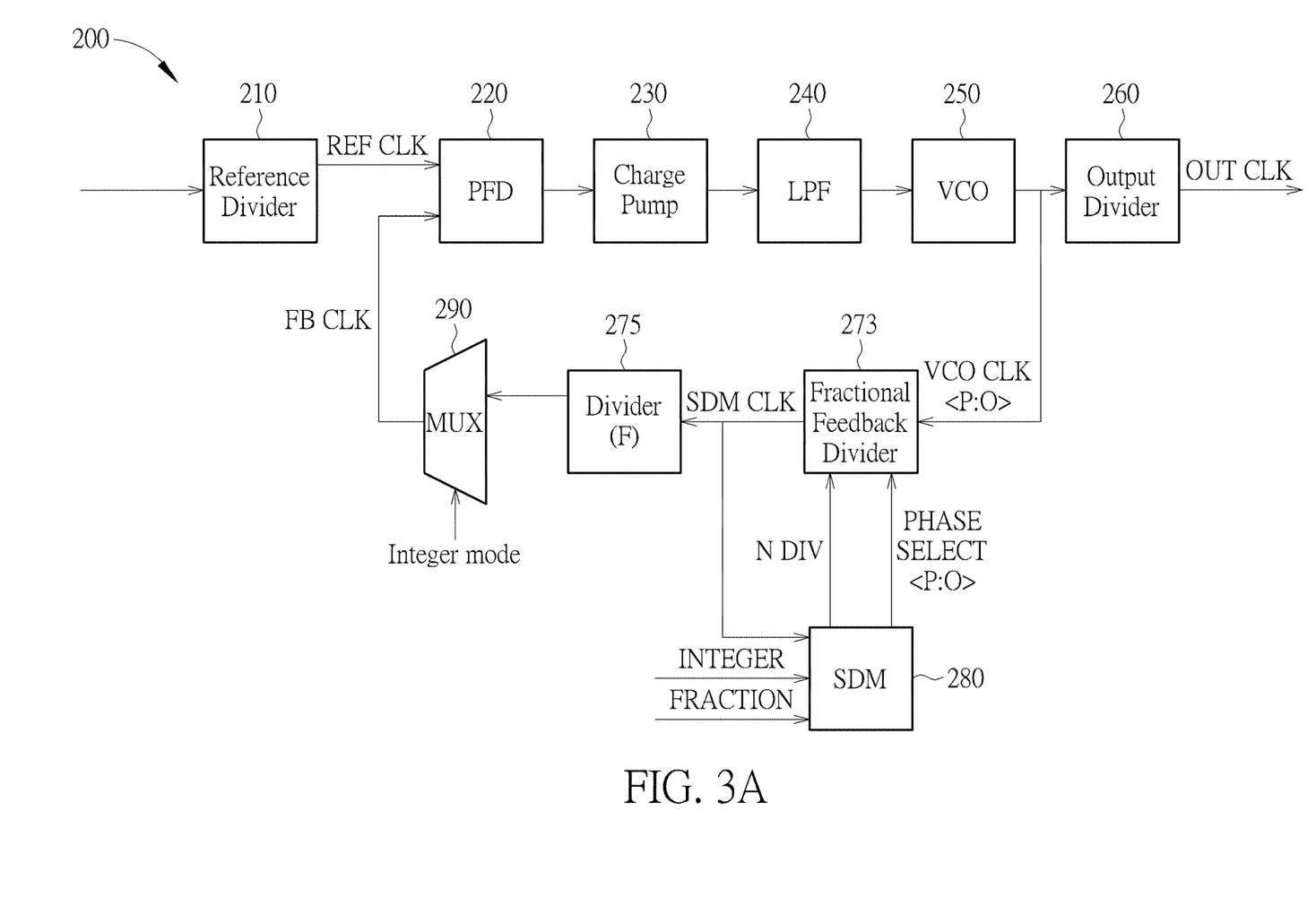
FIG. 3A is a diagram of the PLL shown in FIG. 2 operating in integer mode.

Refer to FIG. 3A which illustrates the PLL 200 operating in fractional mode. Due to the SDM 280 generating the modulated sequence to the fractional feedback divider 273 such that a fractional modulus can be generated, the SDM 280 receives both the integer input and the fractional input, and generates both the modulated sequence N DIV and the phase select signal <P:0> to the fractional feedback divider 273. The SDM CLK is fed back to the SDM 280 but is not input to the MUX 290. The MUX outputs the divided clock received from the Divider (F) as the feedback clock FB CLK, which will be a lower frequency than the SDM CLK by a factor of F.

Figure 3B:
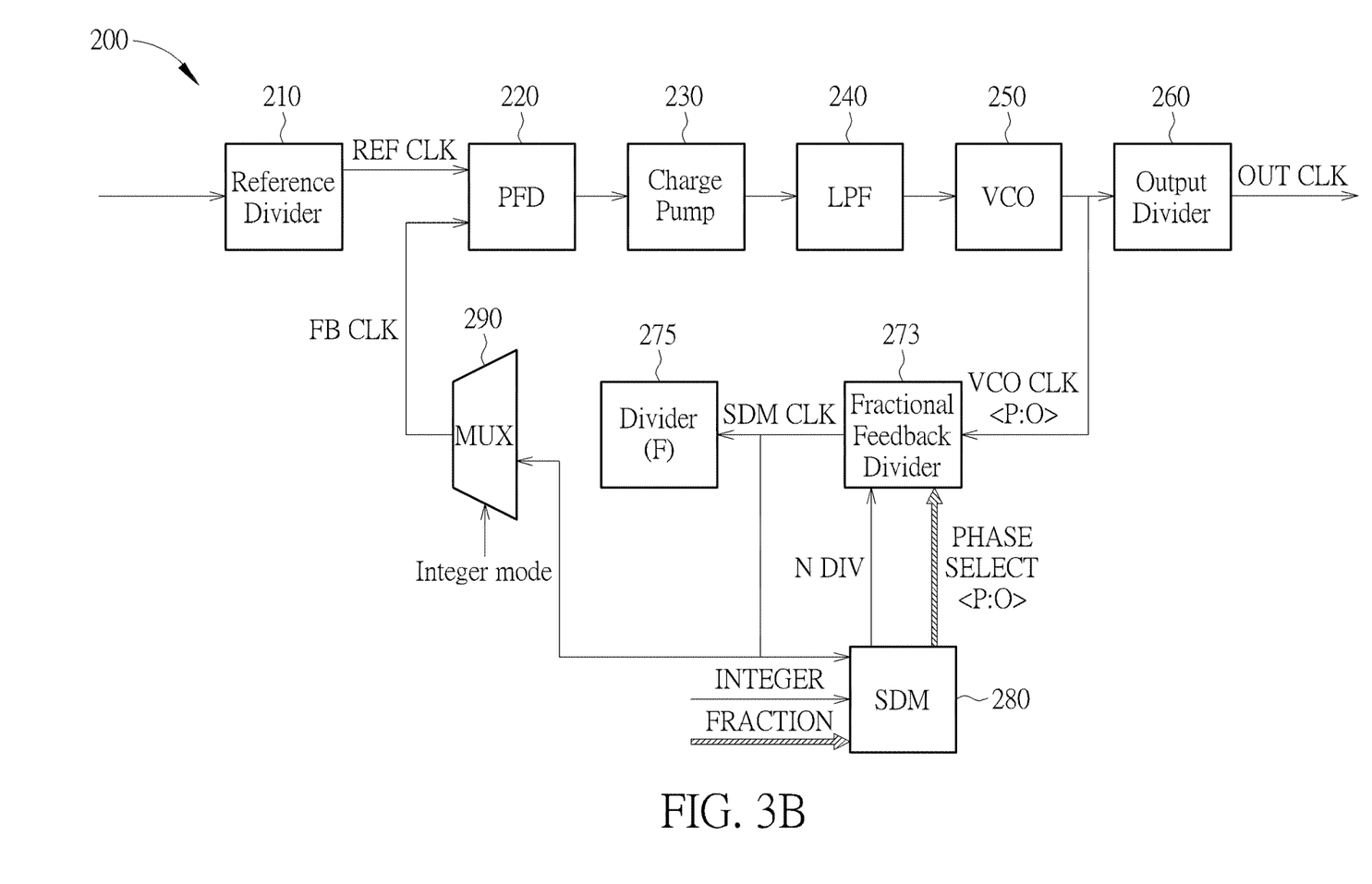
FIG. 3B is a diagram of the PLL shown in FIG. 2 operating in fractional mode.

Refer to FIG. 3B, which illustrates an operation of the PLL 200 in integer mode. As illustrated in the diagram, there is no fraction input to the SDM 280. Further, the Phase Select <P:0> from the SDM 280 is also not input to the Fractional Feedback Divider 273, such that the same modulus applies to the Fractional Feedback Divider 273 for each clock cycle. Although the SDM CLK is input to the Divider (F) 275, the resultant signal is not output to the MUX 290, due to the integer mode signal being active. Therefore, the un-divided SDM CLK is input directly to the MUX 290 as well as being fed back to the SDM 280. In this situation, the PLL 200 operates as a standard integer PLL, wherein the SDM CLK will have the same frequency as the FB CLK.

By including the Divider (F) 275, the SDM CLK can have double the frequency as compared to the prior art, but can still be divided down in order to approach the frequency of the reference clock REF CLK. Due to the low-pass characteristics of the Loop Filter 240, higher frequency components will not be passed at the output so less jitter occurs overall.

Figure 4A:
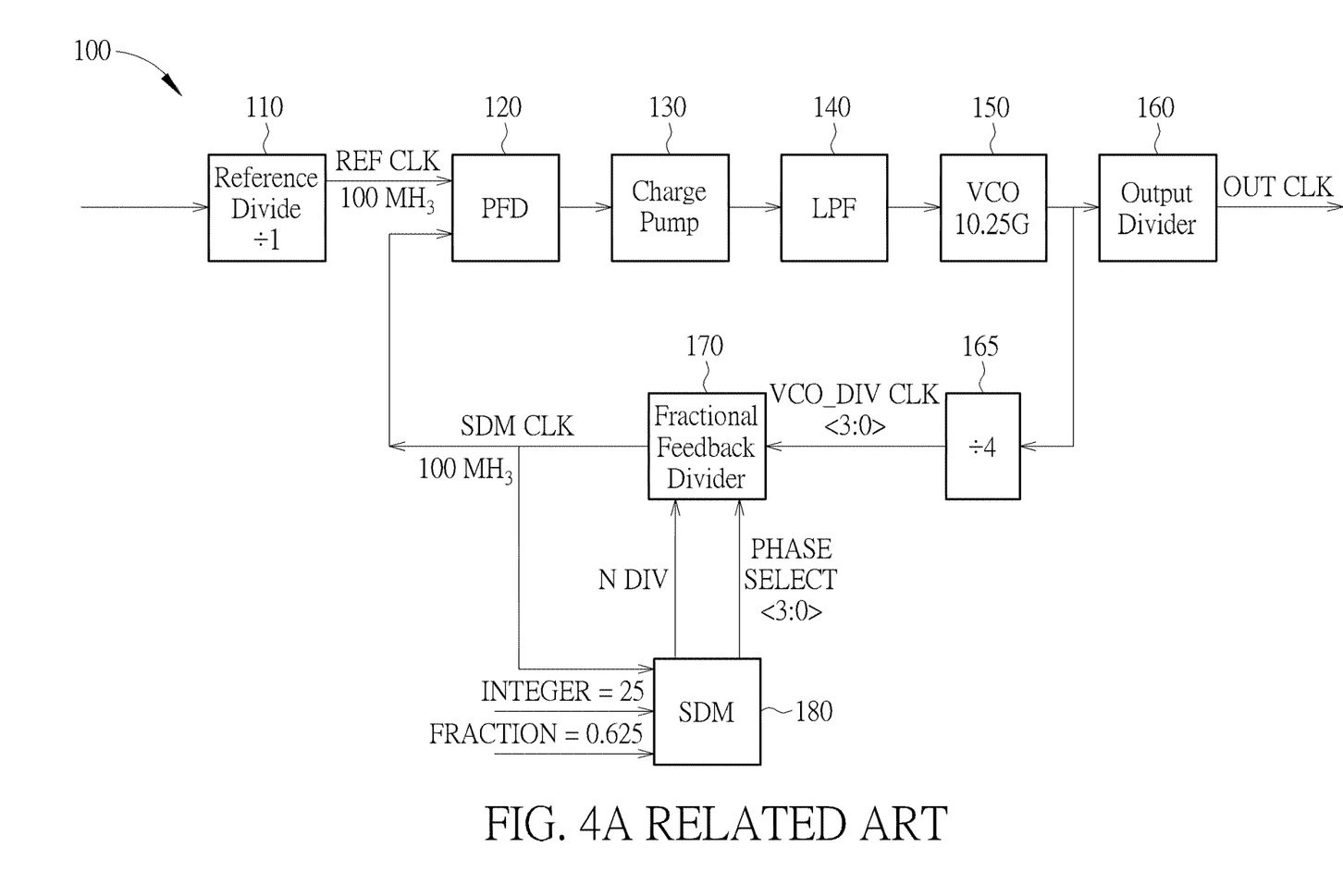
FIG. 4A is a diagram illustrating an operation of the PLL shown in FIG. 1.
Figure 4B:
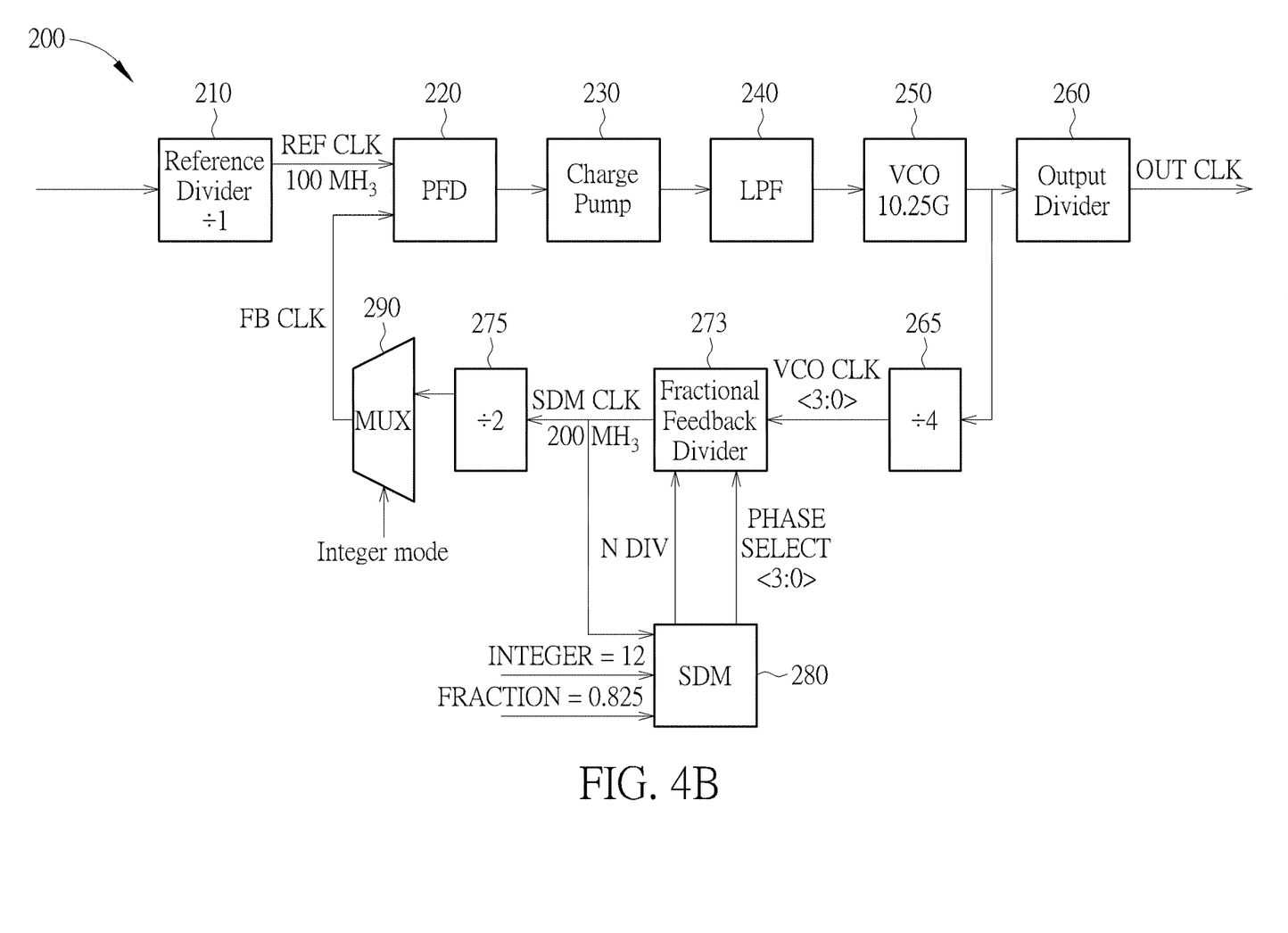
FIG. 4B is a diagram illustrating an operation of the PLL shown in FIG. 2.

An illustration of this is shown in FIG. 4A and FIG. 4B. FIG. 4A is an illustration of the operation of the PLL 100 shown in FIG. 1. The PLL 100 also includes a divide-by-4 circuit 165. Please note this is merely to help illustrate the method better, and the PLL 100 may include a divider circuit with a different modulus or may not include any divider circuit. Assuming the VCO is desired to be operated at 10.25 G, the inputs to the SDM 180 are an integer value=25, and a fraction value=0.625. Due to the divide-by-4 circuit 165, a VCO_DIV CLK will be <3:0>, and the phase select signal generated by the SDM 180 will also be <3:0>. This will result in the SDM CLK being generated at a frequency of 100 MHz.

FIG. 4B illustrates an operation of the PLL 200 shown in FIG. 2. In this example, the PLL 200 is operating in fractional mode. As in FIG. 4A, the PLL 200 also includes a divide-by-4 circuit 265, such that the VCO CLK is <3:0>, and the SDM 280 generates a Phase Select signal <3:0>. In this example, the Divider (F) 275 has a modulus of 2, and the inputs to the SDM 280 are integer=12 and fraction=0.825. As the PLL 200 is operating in fractional mode, the output of the Divider (F) 275 will be input to the MUX 290 as well as being fed back to the SDM 280. Due to the presence of the Divider (F) 275 having a modulus of 2, the SDM CLK can be generated at a frequency of 200 MHz, which will then be divided by 2 to generate the FB CLK at a frequency of 100 MHz. Any noise generated by the SDM 280 will be at a higher frequency and will therefore not be passed by the LPF 240, such that less noise is seen at the output of the PLL 200 in comparison with the PLL 100.

The design of the SDM 280 will affect the size of the Divider (F) 275. The size of both and the frequency of the input clock will depend on what is achievable.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Phase Locked Loop (PLL) with reduced jitter, the PLL comprising:
    a phase detector, for receiving a reference clock and a feedback clock, and comparing phases of the reference clock and feedback clock to generate up and down control signals;
    a Voltage Controlled Oscillator (VCO) for generating an oscillation signal according to the up and down control signals;
    an output divider, for dividing the oscillation signal to generate an output clock; and
    a feedback loop, for receiving the oscillation signal and dividing the oscillation signal according to a modulus to generate the feedback clock, the feedback loop comprising:
        a fractional feedback divider for receiving the oscillation signal and performing frequency division on the oscillation signal according to a modulated sequence to generate a modulated clock, wherein an average of the modulated sequence over a plurality of clock cycles is a fractional number; and
        a divider coupled in series to the fractional feedback divider, for dividing the modulated clock of the fractional feedback divider by a fixed modulus to generate a divided clock;
    wherein a frequency of the modulated clock of the fractional feedback divider is an integer multiple of the frequency of the divided clock, and one of the modulated clock and the divided clock is used as the feedback clock.

2. The PLL of claim 1, wherein the feedback loop further comprises:
    a Sigma Delta Modulator (SDM), coupled to the fractional feedback divider, for generating the modulated sequence according to an integer division factor and a fractional division factor.

3. The PLL of claim 2, wherein the SDM further generates a phase select signal to the fractional feedback divider, and receives the modulated clock of the fractional feedback divider.

4. The PLL of claim 3, further comprising:
   a Multiplexer (MUX), for receiving the divided clock from the divider and the modulated clock from the SDM, and according to an input signal, outputting either the divided clock or the modulated clock to the phase detector as the feedback clock.

5. The PLL of claim 4, wherein when the input signal is high, the PLL is configured as an integer-N PLL, the SDM generates the modulated sequence according to the integer division factor only, and the MUX directly selects the modulated clock output from the fractional feedback divider as the feedback clock; and when the input signal is low, the PLL is configured as a fractional-N PLL, the SDM generates the modulated sequence according to both the integer division factor and the fractional division factor, and the MUX selects the divided clock output from the divider as the feedback clock.

6. The PLL of claim 2, further comprising:
   a charge pump that generates an analog control signal according to the up and down control signals output by the phase detector; and
   a loop filter for filtering the analog control signal to generate a filtered signal which is input to the VCO.

7. The PLL of claim 1, wherein the frequency of the modulated clock of the fractional feedback divider is double the frequency of the divided clock.

8. A method for generating an output clock with reduced jitter from a reference clock, the method comprising:
   receiving a reference clock and a feedback clock, and comparing the phases of the reference clock and feedback clock to generate up and down control signals;
   generating an oscillation signal according to the up and down control signals;
   performing frequency division on the oscillation signal according to a modulated sequence to generate a modulated clock wherein an average of the modulated sequence over a plurality of clock cycles is a fractional number;
   dividing the modulated clock by a fixed modulus to generate a divided clock; and
   utilizing one of the modulated clock and the divided clock as the feedback clock;
   wherein a frequency of the modulated clock is an integer multiple of the frequency of the divided clock.

9. The method of claim 8, wherein the step of performing frequency division on the oscillation signal according to a modulated sequence further comprises generating the modulated sequence according to an integer division factor and a fractional division factor.

10. The method of claim 9, further comprising:
    generating a phase select signal.

11. The method of claim 8, further comprising:
    utilizing one of the divided clock or the modulated clock as the feedback clock according to an input signal.

12. The method of claim 11, wherein when the input signal is high, the modulated clock is selected as the feedback clock; and when the input signal is low, the divided clock is selected as the feedback clock.

13. The method of claim 8, wherein the step of generating an oscillation signal according to the up and down signals comprises:
    generating an analog control signal according to the up and down control signals; and
    filtering the analog control signal to generate a filtered signal, which is used to generate the oscillation signal.

14. The method of claim 8, wherein the frequency of the modulated clock is double the frequency of the divided clock.

* * * * *